United States Patent
Pisarevsky et al.

(10) Patent No.: US 7,348,902 B2
(45) Date of Patent: Mar. 25, 2008

(54) METHOD FOR EFFICIENT VARIABLE LENGTH DECODING

(75) Inventors: Vadim Pisarevsky, Nizhny Novgorod (RU); Sergey Zheltov, Nizhny Novgorod (RU); Alexander Irhin, Nizhny Novgorod (RU); Stanislav Bratanov, Nizhny Novgorod (RU)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/566,140

(22) PCT Filed: Jul. 29, 2003

(86) PCT No.: PCT/RU03/00339

§ 371 (c)(1),
(2), (4) Date: Apr. 27, 2006

(87) PCT Pub. No.: WO2005/013493

PCT Pub. Date: Feb. 10, 2005

(65) Prior Publication Data

US 2007/0109160 A1    May 17, 2007

(51) Int. Cl.
*H03M 7/40* (2006.01)
(52) U.S. Cl. .................................... 341/67; 341/65
(58) Field of Classification Search ............ 341/65, 341/67

See application file for complete search history.

(56) References Cited

U.S. PATENT DOCUMENTS 4,475,174 A    10/1984    Kanayama (Continued)

FOREIGN PATENT DOCUMENTS

EP    1 303 049 A1    4/2003

(Continued)

OTHER PUBLICATIONS

International Application No. PCT/RU2003/000339, International Search Report, 5 pages mailed date Apr. 8, 2004.

*Primary Examiner*—Khai M. Nguyen
(74) *Attorney, Agent, or Firm*—Blakely, Sokoloff, Taylor & Zafman LLP (57) ABSTRACT

Embodiments of the present invention perform efficient decoding of variable length codes statically defined by a coding standard for a wide range of source data. According to the disclosed method, special data structures (decoding tables) are created. A bit set size is associated with each decoding table. Each decoding table contains a decoded value, actual code length, reference to another table (from the set of created tables), and validity indicator for each bit combination that can be formed from the number of bits equal to the bit set size. An active decoding table is selected. Then the number of bits equal to the bit set size associated with the active decoding table is read from a bit stream. The active decoding table is indexed with the actual value of bits read to obtain the decoded value, actual code length, reference to another table, and validity indicator. The validity indicator is then checked to determine whether the decoded value obtained is valid. If the decoded value is indicated to be invalid, the decoding table that is referenced by the currently active table is selected to become active, and the decoding process continues. Otherwise, the bit steam is adjusted in accordance with the actual code length obtained and the hit set size associated with the decoding tables that were active during the decoding. The decoded value is then returned.

27 Claims, 3 Drawing Sheets

U.S. PATENT DOCUMENTS

| | | |
|---|---|---|
| 5,559,831 A | 9/1996 | Keith |
| 5,614,900 A * | 3/1997 | Watanabe ................... 341/67 |
| 6,008,745 A | 12/1999 | Zandi et al. |
| 6,219,457 B1 | 4/2001 | Potu |
| 6,433,709 B1 | 8/2002 | Oue |
| 6,573,847 B1 | 6/2003 | Wang |
| 6,891,976 B2 * | 5/2005 | Zheltov et al. ............. 382/246 |
| 2001/0012365 A1 | 8/2001 | Gaedke et al. |

FOREIGN PATENT DOCUMENTS

| | | |
|---|---|---|
| EP | 0 647 034 A1 | 4/2005 |
| WO | WO 01/31794 A1 | 5/2001 |

* cited by examiner

|  | VARIABLE LENGTH CODES | | | VALUES |
|---|---|---|---|---|
| 1-4 BIT CODES 12 | 1 | | | 0 |
| | 010 | | | 1 |
| | 011 | | | -1 |
| | 0010 | | | 2 |
| | 0011 | | | -2 |
| 5-7 BIT CODES 14 | 0001 | 0 | | 3 |
| | 0001 | 1 | | -3 |
| | 0000 | 100 | | 4 |
| | 0000 | 101 | | 5 |
| | 0000 | 110 | | 6 |
| | 0000 | 111 | | -4 |
| 8- BIT CODES 16 | 0000 | 010 | 0 | 7 |
| | 0000 | 010 | 1 | 8 |

METHOD FOR EFFICIENT VARIABLE LENGTH DECODING

CROSS-REFERENCE TO RELATED APPLICATION

This application is a National Phase application of, and claims priority to, International Application No. PCT/RU2003/000339, filed Jul. 29, 2003, entitled A METHOD FOR EFFICIENT VARIABLE LENGTH DECODING.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field

The present invention relates generally to decoding of variable-length codes, e.g., Huffman codes, and, more specifically, to a new decoding scheme based on multiple interconnected lookup tables.

2. Description

Entropy coding is a widely used data compression technique that many video and audio coding standards are based on. The theoretical basis of entropy coding states that a compression effect can be reached when the most frequently used data are coded with a fewer number of bits than the number of bits denoting the less frequently appearing data. This approach results in coded data streams composed of codes having different lengths.

There are a number of methods to form such variable length codes (VLC). One popular method uses a prefixed coding in which a code consists of a prefix that allows a decoding system to distinguish between different codes, and several significant bits representing a particular value (e.g., Huffman coding).

Another method may use postfix coding schemes where variable length bit patterns are appended to the significant bits.

As most coding standards employ Huffman codes and provide statically pre-coded VLC tables for motion picture coding (e.g., ISO/IEC 11172-2, Moving Pictures Experts Group (MPEG)-1 coding standard: Video; ISO/IEC 13818-2, MPEG-2 coding standard: Video; ISO/IEC 14496-2, MPEG-4 coding standard: Visual), it is not always true that the most probable data is coded with the shortest VLCs. Moreover, the probability distributions for particular video streams may have several peaks which means that there may be several code groups comprising VLCs of different lengths that are likely to appear. In this case the variable length decoding methods operating on theoretically predicted probability distributions may have lower performance as compared to methods that can be adapted to the actual VLC probabilities.

Therefore, a need exists for the capability to provide high speed decoding of variable length codes of different origin, in accordance with the actual frequency-to-code length distribution.

BRIEF DESCRIPTION OF THE DRAWINGS

The features and advantages of the present invention will become apparent from the following detailed description of the present invention in which.

DETAILED DESCRIPTION

An embodiment of the present invention is a method for efficient decoding of variable length codes statically defined by a coding standard for a wide range of source data. The static definition implies that the source data may differ from the data used to compute statistical information for a particular standard, thus, the real probability distributions for variable length codes may vary from standard-defined values. According to the disclosed method, special data structures (or decoding tables) are created. A bit set size is associated with each decoding table. Each decoding table element contains a decoded value, actual code length, reference to another table (from the set of created tables), and a validity indicator for each bit combination that can be formed from the number of bits equal to the bit set size. An active decoding table is selected. Then the number of bits equal to the bit set size associated with the active decoding table is read from a bit stream. The active decoding table is indexed with the actual value of bits read to obtain the decoded value, actual code length, reference to another table, and validity indicator. The validity indicator is then checked to determine whether the decoded value obtained is valid. If the decoded value is indicated to be invalid, the decoding table that is referenced by the currently active table is selected to become active, and the decoding process continues. Otherwise, the bit stream is adjusted in accordance with the actual code length obtained and the bit set size associated with the decoding tables that were active during the decoding. The decoded value is then returned.

The disclosed method provides for the probability variance by enabling fast decoding of a VLC group, which is determined to contain the most probable codes. Though the determination is performed by means beyond the scope of the present invention, one embodiment may adjust the decoding tables and their associated bit set size based on the results of said determination.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

Figure 1:
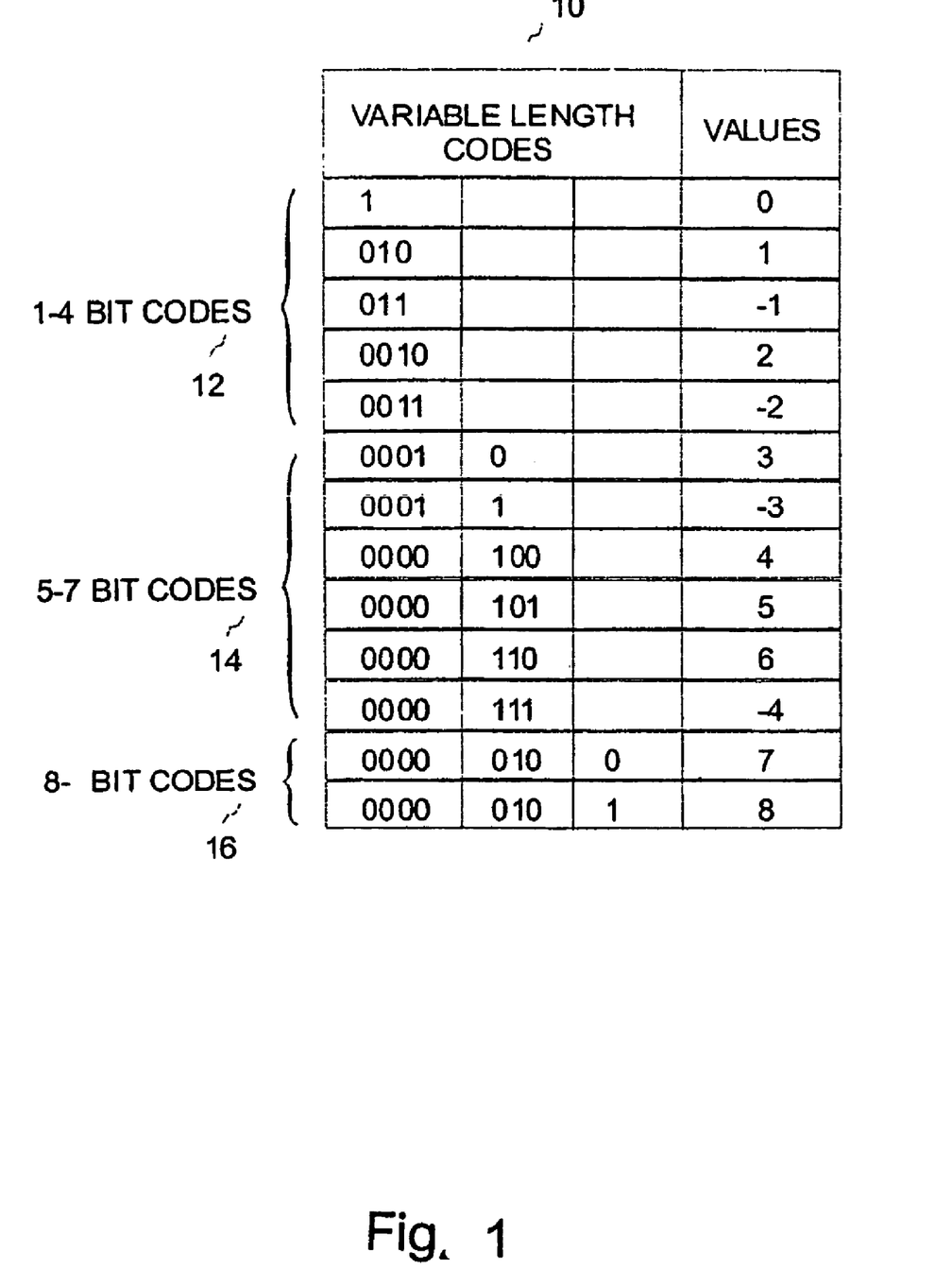
FIG. 1 is a diagram illustrating an exemplary variable length coding.

FIG. 1 is a diagram illustrating an exemplary variable length coding. As depicted by FIG. 1, a coding scheme represented by table 10 may be comprised of several groups of variable length codes; each group assigned a probability value. Unlike other variable length decoding methods that assume the shortest codes to be the most probable, embodiments of the present invention operate on probability code groups rather than individual codes. This allows for a variance between standard-defined probability distributions and the actual distributions, as they appear, for example, in natural video streams. One embodiment of the present invention may form as many code groups as it may be necessary to span all probability distribution peaks in a manner that allows codes within a pre-defined neighborhood of a peak probability to comprise one group. In the example shown in FIG. 1, the coding scheme 10 was divided into the following code groups: 1-, 3-; and 4-bit codes 12; 5- and 7-bit codes 14; and 8-bit codes 16.

Figure 2:
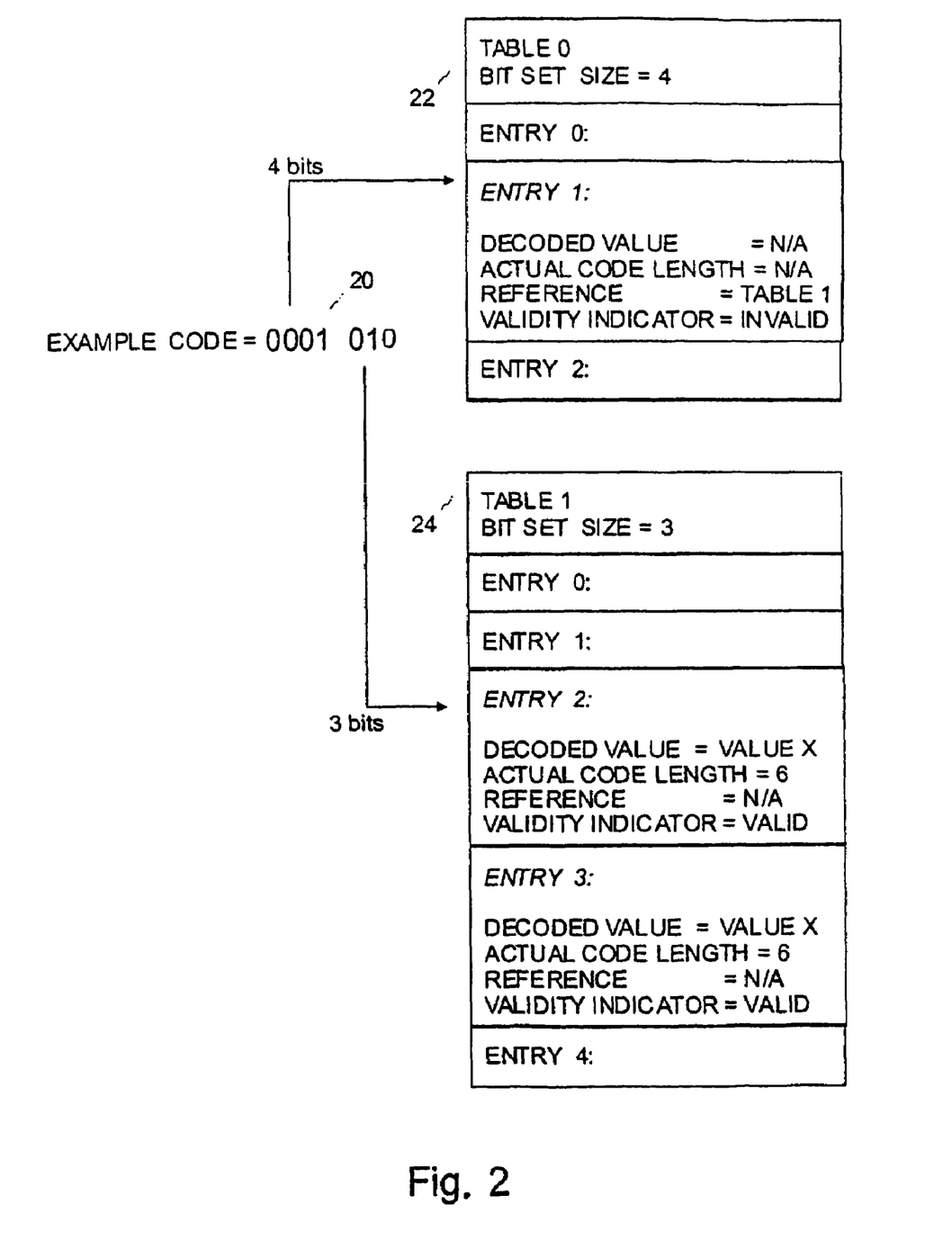
FIG. 2 is a diagram illustrating relations between bits read from a bit stream, a bit set size, and tables containing decoded values, actual code length, references to another tables, and validity indicators.

FIG. 2 is a diagram illustrating relations between bits read from a bit stream, a bit set size, and tables containing decoded values, actual code length, references to another tables, and validity indicators in accordance with an embodiment of the present invention. As depicted in the example of FIG. 2, the first four bits of an example code 20 may be read from the bit stream in accordance with the bit set size associated with the initial decoding table 22. The actual value of the bits read may be used as an index to the decoding table. In one embodiment, the bit set size associated with a decoding table comprises a maximal number of bits used to index the decoding table. As the validity indicator obtained from the indexed entry indicates the decoded value to be invalid, the latter may be ignored along with the actual code size. The reference obtained from the same entry of the decoding table 22 may be used to select the next active table 24 for further decoding. The next three bits of the example code 20 may be read from the bit stream as the bit set size associated with the decoding table 24 equals 3 (in this example). The actual value of the bits read may be used as an index to the decoding table 24, where two entries describing the same VLC are reserved, because the actual bits read that contain the VLC being decoded may also have trailing bits irrelevant to the current variable length code (one irrelevant bit of smaller font size in this example). As the validity indicator obtained from the indexed entry indicates the decoded value to be valid, the reference to another table may be ignored, and the decoded value and actual VLC size may be returned.

One skilled in the art will recognize various modifications that can be made to particular embodiments while staying within the spirit and scope of the present invention. For example, the actual code length stored in decoding tables may contain an absolute VLC length or a length relative to the bit set size of the currently active table. The validity indicator may be combined with the reference to another table as the two fields mutually exclude each other. And finally, all decoding table elements may be packed into one machine word if their size allows it.

Figure 3:
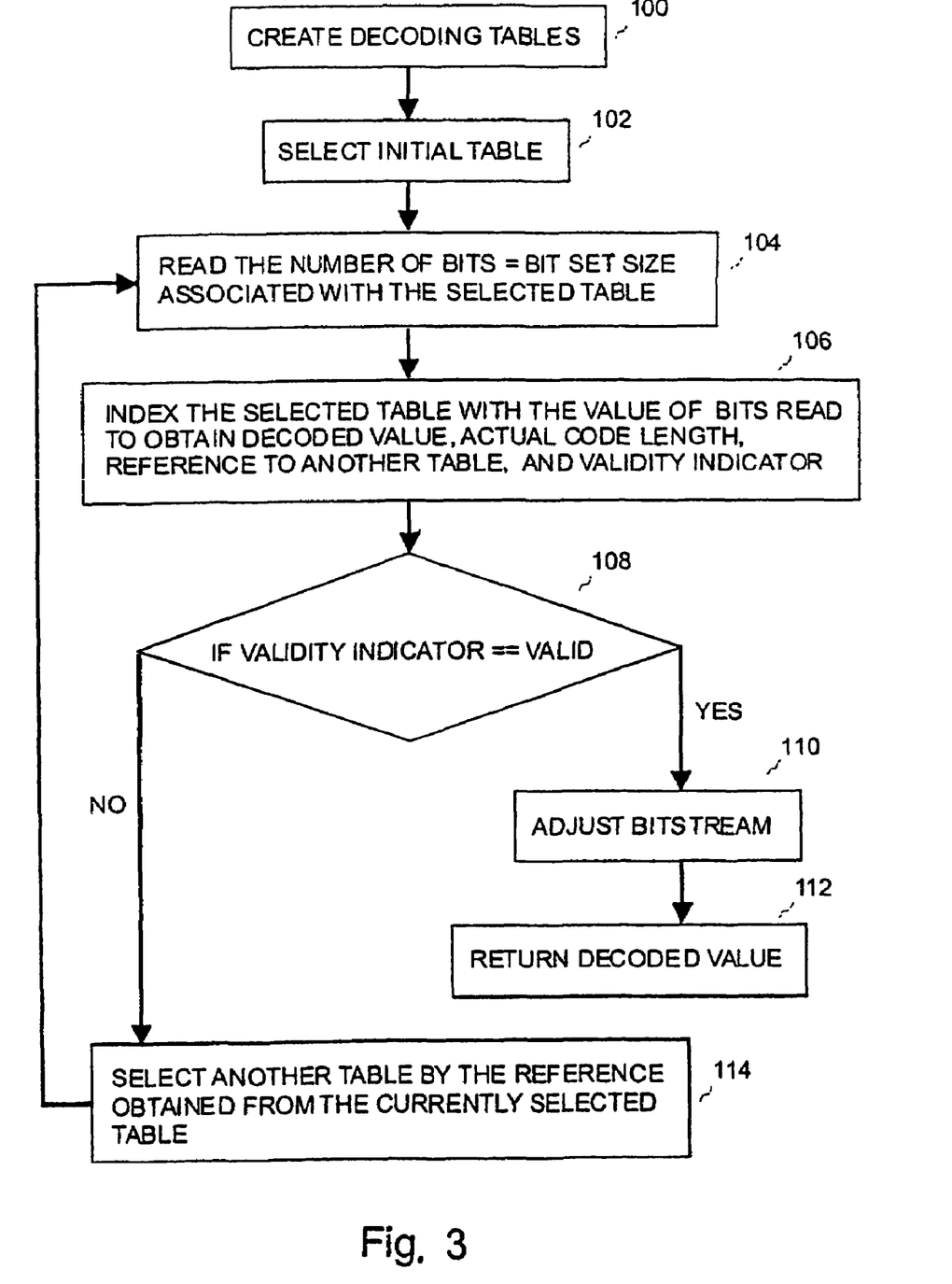
FIG. 3 is a flow diagram illustrating the variable length decoding process in accordance with an embodiment of the present invention.

FIG. 3 is a flow diagram illustrating the variable length decoding process in accordance with an embodiment of the present invention.

At block 100, a set of decoding tables may be created. The tables should comply with the above described requirements regarding probability grouping. Then, at block 102, the initial table may be selected. The number of bits equal to the bit set size associated with the currently selected table may be read from the bit stream at block 104. The actual value of the bits read may be used to index the currently active table at block 106 in order to obtain a decoded value, actual bit length, reference to another table, and validity indicator. Then, at block 108, the validity indicator is checked to determine whether the decoded value obtained is valid. If the decoded value is indicated to be invalid, the decoding table that is referenced by the currently active table is selected to become active at block 114, and the control is passed to block 104. Otherwise, when the decoded value is indicated to be valid, the bit stream is adjusted at block 110 in accordance with the actual code length obtained and with the bit set size associated with the decoding tables that were active during the decoding, i.e., the trailing bits that are not part of the decoded VLC are made accessible for future bit stream operations. The decoded value is then returned at block 112.

For an exemplary embodiment of the present invention implemented in the C and Assembler programming languages, refer to Appendix A. This example is non-limiting and one skilled in the art may implement the present invention in other programming languages without departing from the scope of the claimed invention.

The techniques described herein are not limited to any particular hardware or software configuration; they may find applicability in any computing or processing environment. The techniques may be implemented in logic embodied in hardware, software, or firmware components, or a combination of the above. The techniques may be implemented in programs executing on programmable machines such as mobile or stationary computers, personal digital assistants, set top boxes, cellular telephones and pagers, and other electronic devices, that each include a processor, a storage medium readable by the processor (including volatile and non-volatile memory and/or storage elements); at least one input device, and one or more output devices. Program code is applied to the data entered using the input device to perform the functions described and to generate output information. The output information may be applied to one or more output devices. One of ordinary skill in the art may appreciate that the invention can be practiced with various computer system configurations, including multiprocessor systems, minicomputers, mainframe computers, and the like. The invention can also be practiced in distributed computing environments where tasks may be performed by remote processing devices that are linked through a communications network.

Each program may be implemented in a high level procedural or object oriented programming language to communicate with a processing system. However, programs may be implemented in assembly or machine language, if desired. In any case, the language may be compiled or interpreted.

Program instructions may be used to cause a general-purpose or special-purpose processing system that is programmed with the instructions to perform the operations described herein. Alternatively, the operations may be performed by specific hardware components that contain hard-wired logic for performing the operations, or by any combination of programmed computer components and custom hardware components. The methods described herein may be provided as a computer program product that may include a machine readable medium having stored thereon instructions that may be used to program a processing system or other electronic device to perform the methods. The term "machine readable medium" used herein shall include any medium that is capable of storing or encoding a sequence of instructions for execution by the machine and that cause the machine to perform any one of the methods described herein. The term "machine readable medium" shall accordingly include, but not be limited to, solid-state memories, and optical and magnetic disks. Furthermore, it is common in the art to speak of software, in one form or another (e.g., program, procedure, process, application, module, logic, and so on) as taking an action or causing a result. Such expressions are merely a shorthand way of stating the execution of the software by a processing system cause the processor to perform an action or produce a result.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

APPENDIX A

© 2002 Intel Corporation
GetVLC function (Assembler)
InitTable function ("C")
Input table ("C") and initial Huffman table (text)
Bit stream structure ("C")

Initial Huffman code table

```
/*
Codes              Vector differences
          1                0
        010                1
        011               -1
       0010                2
       0011               -2
      00010                3
      00011               -3
     0000110               4
     0000111              -4
    00001010               5
    00001011              -5
    00001000               6
    00001001              -6
    00000110               7
    00000111              -7
   0000010110              8
   0000010111             -8
   0000010100              9
   0000010101             -9
   0000010010             10
   0000010011            -10
   00000100010            11
   00000100011            -1
   00000100000            12
   00000100001           -12
   00000011110            13
   00000011111           -13
   00000011100            14
   00000011101           -14
   00000011010            15
   00000011011           -15
   00000011000            16
   00000011001           -16
   00000010110            17
   00000010111           -17
   00000010100            18
   00000010101           -18
   00000010010            19
   00000010011           -19
   00000010000            20
   00000010001           -20
*/
```

Packed code/value table containing information on prefix length and significant bit number

```
static const long exTable[ ] =
{
    13, /* max bits */
    3,  /* total subtables */
```

-continued

```
    5, 5, 3, ///3, 5, 5, /* subtable sizes */
    1, /* 1-bit codes */
0x00010000,
    0, /* 2-bit codes */
    2, /* 3-bit codes */
0x00020001,    0x0003ffff,
    2, /* 4-bit codes */
0x00020002,    0x0003fffe,
    2, /* 5-bit codes */
0x00020003,    0x0003fffd,
    0, /* 6-bit codes */
    2, /* 7-bit codes */
0x00060004,    0x0007fffc,
    6, /* 8-bit codes */
0x000a0005,    0x000bfffb,    0x00080006,    0x0009fffa,
0x00060007,    0x0007fff9,
    0, /* 9-bit codes */
    6, /* 10-bit codes */
0x00160008,    0x0017fff8,    0x00140009,    0x0015fff7,
0x0012000a,    0x0013fff6,
    28, /* 11-bit codes */
0x0022000b,    0x0023fff5,    0x0020000c,    0x0021fff4,
0x001e000d,    0x001ffff3,    0x001c000e,    0x001dfff2,
0x001a000f,    0x001bfff1,    0x00180010,    0x0019fff0,
0x00160011,    0x0017ffef,    0x00140012,    0x0015ffee,
0x00120013,    0x0013ffed,    0x00100014,    0x0011ffec,
0x000e0015,    0x000fffeb,    0x000c0016,    0x000dffea,
0x000a0017,    0x000bffe9,    0x00080018,    0x0009ffe8,
    12, /* 12-bit codes */
0x000e0019,    0x000fffe7,    0x000c001a,    0x000dffe6,
0x000a001b,    0x000bffe5,    0x0008001c,    0x0009ffe4,
0x0006001d,    0x0007ffe3,    0x0004001e,    0x0005ffe2,
    4, /* 13-bit codes */
0x0006001f,    0x0007ffe1,    0x00040020,    0x0005ffe0,
    -1 /* end of table */
};
```

Bit Stream Structures

```
typedef struct __MplDataBuf
{
    unsigned char    *data;
    long             data_len;
    long             data_offset;
} MplDataBuf;
typedef struct __MplBitStream
{
    long             bit_ptr;       // Buffer bit pointer (31-0)
    MplDataBuf       *data_buf;     // Pointer to data and its size
    unsigned long    *start_data;   // Internal bitsream pointers
    unsigned long    *end_data;
    unsigned long    *current_data;
    FILE             *fd;           // Input or output file
    jmp_buf          exit_point;    // Exit point to handle incorrect vlc codes
} MplBitStream;
#define DATA_BUFFER_SIZE    1*1024*1024
unsigned long bit_mask[33] =
{
    0x00000000,
    0x00000001,    0x00000003,    0x00000007,    0x0000000f,
    0x0000001f,    0x0000003f,    0x0000007f,    0x000000ff,
    0x000001ff,    0x000003ff,    0x000007ff,    0x00000fff,
    0x00001fff,    0x00003fff,    0x00007fff,    0x0000ffff,
    0x0001ffff,    0x0003ffff,    0x0007ffff,    0x000fffff,
    0x001fffff,    0x003fffff,    0x007fffff,    0x00ffffff,
    0x01ffffff,    0x03ffffff,    0x07ffffff,    0x0fffffff,
    0x1fffffff,    0x3fffffff,    0x7fffffff,    0xffffffff
};
```

Function to Form Internal VLC table

```
typedef unsigned long VLCDecodeTable;
static VLCDecodeTable* CreateVLCDecodeTable(const long
*src_table, VLCDecodeTable *table, long *table_size, long
cyr_size)
{
long i, k, n, m, p, ncodes;
long max_bits, vlc_flag;
long table_offset;
long max_tables;
long tables_bits[32];
long totalbits, filled_bits;
long vm4_vlc_code_mask, vm4_vlc_data_mask, vm4_vlc_shift;
    max_bits   = *src_table++;
    vlc_flag   = max_bits & VM4_VLC_LEN_FLAG;
    max_bits   = max_bits & VM4_VLC_LEN;
    max_tables = *src_table++;
    totalbits  = 0;
    for(i = 0; i < max_tables; i++)
    {
        tables_bits[i] = *src_table++;
        totalbits     += tables_bits[i];
    }
    if(totalbits != max_bits) return 0;
    table_offset = (1 << (tables_bits[0] + 1)) + 1;
    assert(table_offset + cyr_size < VLC_STORAGE_SIZE);
    table[0] = tables_bits[0];
    switch(vlc_flag)
    {
    case VM4_VLC_20:
        vm4_vlc_code_mask = 0xfffff000;
        vm4_vlc_data_mask = 0x00000fff;
        vm4_vlc_shift     = 12;
        break;
    case VM4_VLC_24:
        vm4_vlc_code_mask = 0xffffff00;
        vm4_vlc_data_mask = 0x000000ff;
        vm4_vlc_shift     = 8;
        break;
    default:
        vm4_vlc_code_mask = 0xffff0000;
        vm4_vlc_data_mask = 0x0000ffff;
        vm4_vlc_shift     = 16;
        break;
    }
    for(k = 1; k <= tables_bits[0]; k++)
    {
        long shift      = tables_bits[0] - k;
        long fill_codes = 1 << (shift + 1);
        ncodes = *src_table++;
        for(i = 0; i < ncodes; i++)
        {
            long offset;
            long data, code;
            code = (((*src_table) & vm4_vlc_code_mask)
                    >> vm4_vlc_shift);
            data = (signed short)((*src_table++) &
                    vm4_vlc_data_mask);
            assert(data != VM4_VLC_FORBIDDEN);
            offset = (code << (shift + 1)) + 1;
            for(n = 0; n < fill_codes; n += 2)
            {
                table[offset + n]     = k;
                table[offset + n + 1] = data;
            }
        }
    }
    filled_bits = tables_bits[0];
    m = 1;
    while(max_bits > filled_bits)
    {
        for(k = filled_bits + 1; k <= filled_bits +
tables_bits[m]; k++)
        {
            long shift = filled_bits + tables_bits[m]
                          - k;
            ncodes = *src_table++;
            for(i = 0; i < ncodes; i++)
            {
                long offset, idx;
                long data, code;
                long mask, shift_idx;
                code = (((*src_table) &
                        vm4_vlc_code_mask) >> vm4_vlc_shift);
                data = (signed short)((*src_table++) &
                        vm4_vlc_data_mask);
                assert(data != VM4_VLC_FORBIDDEN);
                offset = 0;
                shift_idx = 0;
                for(p = 0; p < m; p++)
                {
                    long sbits, ssize;
                    shift_idx += tables_bits[p];
                    sbits      = tables_bits[p+1];
                    ssize      = (1 << (sbits + 1)) + 1;
                    idx = (((code >> (k - shift_idx)) &
                           ((1 << tables_bits[p]) - 1))<<1)
                           + 1;
                    if(table[idx+offset] ==
VM4_VLC_FORBIDDEN)
                    {
                        table[idx + offset]     = 0;
                        table[idx + offset + 1] =
table_offset;
                        offset = table_offset;
                        table[table_offset] = sbits;
                        table_offset += ssize;
                        assert(table_offset + cyr_size <
VLC_STORAGE_SIZE);
                    }
                    else
                    {
                        offset = table[idx+offset+1];
                    }
                }
                mask = (1<<(k-shift_idx))-1;
                code = code & mask;
                offset += ((code&((1<<tables_bits[m])-
1))<<(shift+1))+1;
                for(n = 0; n < (1<<(tables_bits[m]-
k+filled_bits+1)); n += 2)
                {
                    assert((table[offset + n] ==
VM4_VLC_FORBIDDEN) && (table[offset + n +
1] == VM4_VLC_FORBIDDEN));
                    table[offset + n]     = k -
filled_bits;
                    table[offset + n + 1] = data;
                }
            }
        }
        filled_bits += tables_bits[m++];
    }
    *table_size = table_offset;
    assert(*src_table == -1);
    return (VLCDecodeTable*)table;
}
```

Function to Decode VLC (Assembler)

```
.686
.xmm
xmmword     textequ   <qword>
mmword      textequ   <qword>
.model      FLAT
MplDataBuf        struc       4t
data          dd      ?
data_len      dd      ?
data_offset   dd      ?
MplDataBuf        ends
MplBitStream      struc       4t
bit_ptr       dd      ?       ;;; Buffer bit pointer (31-0)
data_buf      dd      ?       ;;; Pointer to data and its size
start_data    dd      ?       ;;; Internal bitsream pointers
```

-continued

```
end_data         dd       ?
current_data     dd       ?
fd               dd       ?     ;;; Input or output file
exit_point       dd       ?     ;;; Exit point to handle
incorrect        vlc codes
MplBitStream     ends
_TEXT            segment
      extrn              _longjmp:near
;;; unsigned long asmbsGetVLC (MplBitStream *bsm, const
VLCDecodeTable         *vlcTable)
_asmbsGetVLC     proc     near
sizeof_locals    equ      14h
ws       equ     esp + 04h
bsm      equ     dword ptr [eax + 04h]
table    equ     dword ptr [eax + 08h]
         mov     eax,esp
         sub     esp,sizeof_locals
         and     esp,0ffffff0h
         push    eax
         mov     [ws],esi
         mov     [ws + 04h],edi
         mov     [ws + 08h],ecx
         mov     [ws + 0ch],ebx
         mov     [ws + 10h],ebp
         mov     esi,bsm
         mov     edi,table
         sub     ebp,ebp              ;;; ebp == val
do_while_loop:
         mov     ebx,MplBitStream.current_data[esi]
         mov     eax,[ebx]
         mov     edx,[ebx + 4]        ;;; eax:edx =
                                         bitstream data
         mov     ebx,[edi + ebp * 4]
         mov     ecx,MplBitStream.bit_ptr[esi]
         sub     ecx,ebx
         js      negative_ptr         ;;; not taken
positive_ptr:
         mov     MplBitStream.bit_ptr[esi],ecx
         inc     ecx
         shr     eax,cl
         and     eax,bit_mask[ebx * 4]  ;;; eax = data
decode:
         lea     eax,[eax * 2 + ebp + 1]  ;;; eax = pos
         mov     ebp,[edi + eax * 4 + 4]  ;;; ebp = val
         mov     ecx,ebx
         sub     ecx,[edi + eax * 4]     ;;; ecx = unget_bits
         sub     ebx,ecx
         jz      do_while_loop           ;;; if code_len ==
                                            0 ;;;
taken
         cmp     ebp,7defh
         jz      error_handler           ;;; not taken
         mov     eax,ebp
         mov     ebx, MplBitStream.bit_ptr[esi]
         add     ebx,ecx
         test    ebx,60h
         jnz     unget_more
almost_exit:
         mov     MplBitStream.bit_ptr[esi],ebx
exit:
         mov     esi,[ws]
         mov     edi,[ws + 04h]
         mov     ecx,[ws + 08h]
         mov     ebx,[ws + 0ch]
         mov     ebp,[ws + 10h]
         mov     esp,[esp]
         ret
negative_ptr:
         add     ecx,20h
         mov     MplBitStream.bit_ptr[esi],ecx
         add     MplBitStream.current_data[esi],04h
         lea     ecx,[ecx + ebx - 3fh]
         neg     ecx                     ;;; ecx = 31 - (bitptr' +
                                            nbit)
         shld    eax,edx,cl
         mov     ecx,20h
         sub     ecx,ebx
         shr     eax,cl                  ;;; eax = data
         jmp     decode                  ;;; taken
```

-continued

```
unget_more:
         sub     ebx,20h
         sub     MplBitStream.current_data[esi],04h
         jmp     almost_exit
error_handler:
         push    -1
         lea     edx,MplBitStream.exit_point[esi]
         push    edx
         call    _longjmp
         ;;; no return here
         int     00h
_asmbsGetVLC     endp
_TEXT            ends
_DATA            segment
bit_mask         dd       00000000h
                 dd       00000001h,  00000003h,   00000007h,  0000000fh
                 dd       0000001fh,  0000003fh,   0000007fh,  000000ffh
                 dd       000001ffh,  000003ffh,   000007ffh,  00000fffh
                 dd       00001fffh,  00003fffh,   00007fffh,  0000ffffh
                 dd       0001ffffh,  0003ffffh,   0007ffffh,  000fffffh
                 dd       001fffffh,  003fffffh,   007fffffh,  00ffffffh
                 dd       01ffffffh,  03ffffffh,   07ffffffh,  0fffffffh
                 dd       1fffffffh,  3fffffffh,   7fffffffh,  0ffffffffh
_DATA            ends
         end
```

What is claimed is:

1. In a system for decoding variable length codes in a bit stream, a method comprising:
   creating a set of data structures;
   selecting an active data structure;
   retrieving a bit set size associated with the active data structure, the bit set size being the maximal number of bits used to index the active data structure;
   reading a number of bits equal to the bit set size from the bit stream; and
   obtaining, from the active data structure, in accordance with an actual value of the bits read from the bit stream, a decoded value, actual code length, reference to another data structure, and validity indicator associated with a variable length code.

2. The method of claim 1, wherein selecting the active data structure, retrieving the bit set size, reading the number of bits, and obtaining the decoded value, actual code length, reference to another data structure, and validity indicator are repeated until the decoded value is indicated to be valid.

3. The method of claim 1, wherein each data structure, from the set of data structures, comprises a memory area containing the decoded value, actual code length, reference to another data structure, and validity indicator for each bit combination that can be formed from the number of bits equal to the bit set size.

4. The method of claim 1, wherein selecting the active data structure comprises making one predefined data structure from the set of data structures accessible for future operations when the decoding process is initiated.

5. The method of claim 1, wherein selecting the active data structure further comprises making a data structure referenced by the data structure that is currently in use accessible for future operations.

6. The method of claim 1 wherein the reference to another data structure comprises enabling further identification and access to a selected data structure of the set of data structures.

7. The method of claim 1, wherein the validity indicator indicates whether the decoded value is valid.

8. The method of claim 1, further comprising returning excess bits to the bit stream when the actual code length is less than the bit set size of all data structures referenced during decoding of the variable length code.

9. The method of claim 8, wherein returning excess bits further comprises adjusting a bit stream pointer to allow the bits of the bit stream to be further processed on decoding of a next variable length code.

10. An article of manufacture comprising: a machine accessible medium having a plurality of machine readable instructions stored thereon, wherein when the instructions are executed by a processor, the instructions provide for decoding of variable length codes in a bit stream by
creating a set of data structures;
selecting an active data structure;
retrieving a bit set size associated with the active data structure, the bit set size being the maximal number of bits used to index the active data structure;
reading a number of bits equal to the bit set size from the bit stream; and
obtaining, from the active data structure, in accordance with an actual value of the bits read, a decoded value, actual code length, reference to another data structure, and validity indicator associated with a variable length code.

11. The article of claim 10, wherein instructions for selecting the active data structure, retrieving the bit set size, reading the number of bits, obtaining the decoded value, actual code length, reference to another data structure, and validity indicator are repeated until the decoded value is indicated to be valid.

12. The article of claim 10, wherein each data structure, from the set of data structures, comprises a memory area containing the decoded value, actual code length, reference to another data structure, and validity indicator for each bit combination that can be formed from the number of bits equal to the bit set size.

13. The article of claim 10, wherein instructions for selecting the active data structure comprise instructions for making one predefined data structure from the set of data structures accessible for future operations when the decoding process is initiated.

14. The article of claim 10, wherein instructions for selecting the active data structure further comprise instructions for making a data structure referenced by the data structure that is currently in use accessible for future operations.

15. The article of claim 10, wherein the reference to another data structure comprises enabling further identification and access to a selected data structure of the set of data structures.

16. The article of claim 10, wherein the validity indicator indicates whether the decoded value is valid.

17. The article of claim 10, further comprising instructions for returning excess bits to the bit stream when the actual code length is less than the bit set size of all data structures referenced during decoding of the variable length code.

18. The article of claim 17, wherein instructions for returning excess bits further comprise instructions for adjusting a bit stream pointer to allow the bits of the bit stream to be further processed on decoding of a next variable length code.

19. A system for decoding variable length prefix codes in a bit stream, comprising:
logic to create a set of data structures;
logic to select an active data structure;
logic to retrieve a bit set size associated with the active data structure, the bit set size being the maximal number of bits used to index the active data structure;
logic to read a number of bits equal to the bit set size from the bit stream; and
logic to obtain, from the active data structure, in accordance with an actual value of the bits read, a decoded value, actual code length, reference to another data structure, and validity indicator associated with a variable length code.

20. The system of claim 19, wherein logic to select the active data structure, retrieve the bit set size, read the number of bits, obtain the decoded value, actual code length, reference to another data structure, and validity indicator is activated repeatedly until the decoded value is indicated to be valid.

21. The system of claim 19, wherein each data structure, from the set of data structures, comprises a memory area containing the decoded value, actual code length, reference to another data structure, and validity indicator for each bit combination that can be formed from the number of bits equal to the bit set size.

22. The system of claim 19, wherein logic to select the active data structure comprises logic to make one predefined data structure from the set of data structures accessible for future operations when the decoding process is initiated.

23. The system of claim 19, wherein logic to select the active data structure further comprises logic to make a data structure referenced by the data structure that is currently in use accessible for future operations.

24. The system of claim 19, wherein the reference to another data structure comprises means for enabling further identification and access to one data structure of the set of data structures.

25. The system of claim 19, wherein the validity indicator comprises means for determining whether the decoded value is valid.

26. The system of claim 19, further comprising logic to return excess bits to the bit stream when the actual code length is less than the bit set size of all data structures referenced during decoding of the variable length code.

27. The system of claim 26, wherein logic to return excess bits further comprises logic to adjust a bit stream pointer in a way that allows the bits of the bit stream to be further processed on decoding of a next variable length code.

\* \* \* \* \*